(12) United States Patent
Barrett et al.

(10) Patent No.: US 6,256,215 B1
(45) Date of Patent: Jul. 3, 2001

(54) MULTIPLE OUTPUT BOOTSTRAPPED GATE DRIVE CIRCUIT

(75) Inventors: Alfred H. Barrett, Carmel; Joel F. Downey, Kokomo; Richard F. Rouser, Logansport, all of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/635,445

(22) Filed: Aug. 10, 2000

(51) Int. Cl.$^7$ .............................. H02M 5/5387; H02J 1/00
(52) U.S. Cl. ................................. 363/132; 307/77
(58) Field of Search .................. 363/16, 17, 97, 363/98, 131, 132; 307/43, 48, 49, 53, 54, 63, 77, 85

(56) References Cited

U.S. PATENT DOCUMENTS

| | | | |
|---|---|---|---|
| 4,316,243 | * 2/1982 | Archer ................................ | 363/132 |
| 6,043,618 | * 3/2000 | Kawagoshi ........................... | 318/254 |
| 6,151,222 | * 2/1982 | Barrett ................................. | 363/16 |

* cited by examiner

Primary Examiner—Matthew Nguyen
(74) Attorney, Agent, or Firm—Jimmy L. Funke

(57) ABSTRACT

An improved low-cost gate drive circuit drives the bridge transistors of a multiple power supply bridge circuit with a single logic level voltage. In general, the single logic level voltage is referenced to a first power supply and provides gate drive voltages for bridge transistors associated with a second power supply. The logic level voltage is bootstrapped to a first by-pass capacitor to provide a first gate drive voltage for a high-side transistor associated with the first power supply, and the charge on the first by-pass capacitor is consecutively bootstrapped to second and third by-pass capacitors to provide second and third gate drive voltages for bridge transistors associated with the second power supply.

5 Claims, 1 Drawing Sheet

MULTIPLE OUTPUT BOOTSTRAPPED GATE DRIVE CIRCUIT

TECHNICAL FIELD

This invention relates to a low cost bootstrapped gate drive circuit for driving bridge transistors of multiple power supply bridge circuits.

BACKGROUND OF THE INVENTION

Various circuits, including many power supply and motor control circuits, utilize transistor bridge arrangements to selectively couple a load to a power supply. In general, one terminal of the power supply is designated as the circuit common or ground, and transistors that couple a load to the circuit ground are referred to as low-side switches, whereas transistors that couple a load to the other terminal of the power supply or an intermediate potential are referred to as high-side switches. Since the emitter or source of a low-side transistor is referenced to circuit ground, its gate drive circuit may also be referenced to ground, and a simple and inexpensive circuit design may be used. However, the emitter or source of a high-side transistor floats with respect to ground, and its gate drive circuit must therefore be isolated from ground. One technique commonly employed with insulated gate transistor bridges utilizes a capacitor and diode to create a floating power supply for the gate drive of the high-side transistor. This technique, illustrated in FIG. 1, is referred to as bootstrapping, and eliminates the need for expensive transformer isolated power supplies. Referring to FIG. 1, a Low Level Controller 10 generates control signals L1 and H1 for biasing low-side and high-side bridge transistors Q1 and Q2 alternately on and off to alternately couple an electrical load LOAD1 to a ground potential defined by the negative terminal of battery 12 and a source potential VS defined by the positive terminal of battery 12. The Low Level Controller 10 is powered by Logic Level Power Supply 14, which develops a logic level voltage Va, such as 5 VDC. The control signal L1 is applied to gate drive amplifier U1, which switches the gate of low-side transistor Q1 between the logic level voltage Va and ground potential, according to the logic state of the control signal L1. Similarly, the control signal H1 controls the operation of gate drive amplifier U2 for high-side transistor Q2, but in this case a level shifter (LS) 16 is needed since the source of high-side transistor Q2 floats at load potential VL1. A by-pass capacitor C1 supplies a gate drive potential Vb relative to the source of high-side transistor Q2, and Logic Level Power Supply 14 charges capacitor C1 substantially to voltage Va through diode D1 during on periods of low-side transistor Q1. If desired, a by-pass capacitor C2 may also be used to establish a gate drive potential for gate drive amplifier U1, as shown. The drive circuit for high-side transistor Q2 is said to be bootstrapped because its gate drive potential Vb shifts upward with the load potential VL1 when low-side transistor Q1 transitions from on to off. At such point, the gate drive potential Vb is higher than the logic level voltage Va, and the diode D1 is reverse biased. When control signal H1 changes states to turn on high side transistor Q2, the by-pass capacitor C1 supplies the required gate drive energy.

While conventional bootstrapping can be advantageously used in single power supply bridge circuits such as shown in FIG. 1, it can only be used in multiple power supply bridge circuits by providing separate logic level voltages for each power supply, which of course, entails significant expense. Accordingly, what is needed is a simple and inexpensive gate driver circuit having multiple outputs for driving bridge transistors of multiple power supply bridge circuits.

SUMMARY OF THE INVENTION

The present invention is directed to an improved low-cost gate drive circuit for driving the bridge transistors of a multiple power supply bridge circuit with a single logic level voltage. In general, the single logic level voltage is referenced to one of the power supplies (referred to herein as the first power supply) and provides gate drive voltages for bridge transistors associated with all of the power supplies. The logic level voltage is bootstrapped to a first by-pass capacitor to provide a first gate drive voltage for a high-side transistor associated with the first power supply, and the charge on the first by-pass capacitor is consecutively bootstrapped to additional by-pass capacitors to provide multiple gate drive voltages for bridge transistors associated with the other power supplies.

DESCRIPTION OF THE PREFERRED EMBODIMENT

Figure 1:
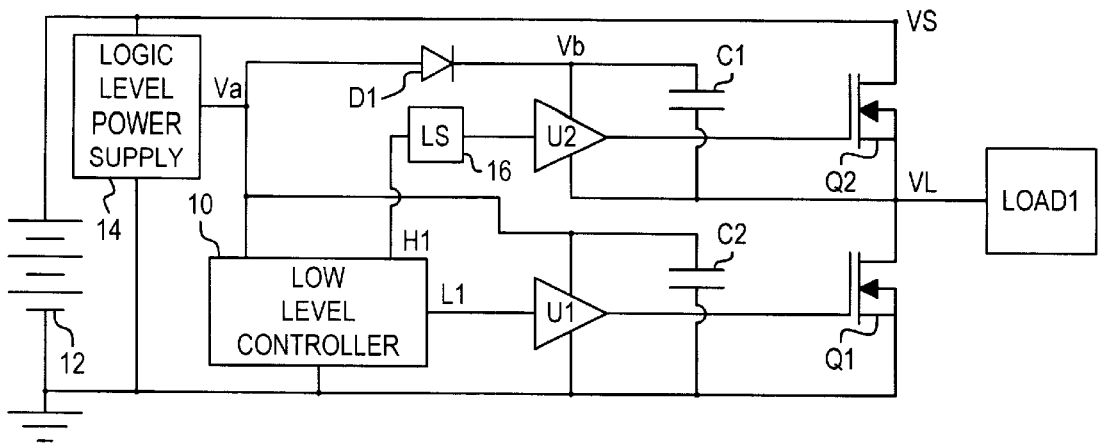
FIG. 1 is a circuit diagram of a conventional (prior art) bootstrapped gate drive circuit.
Figure 2:
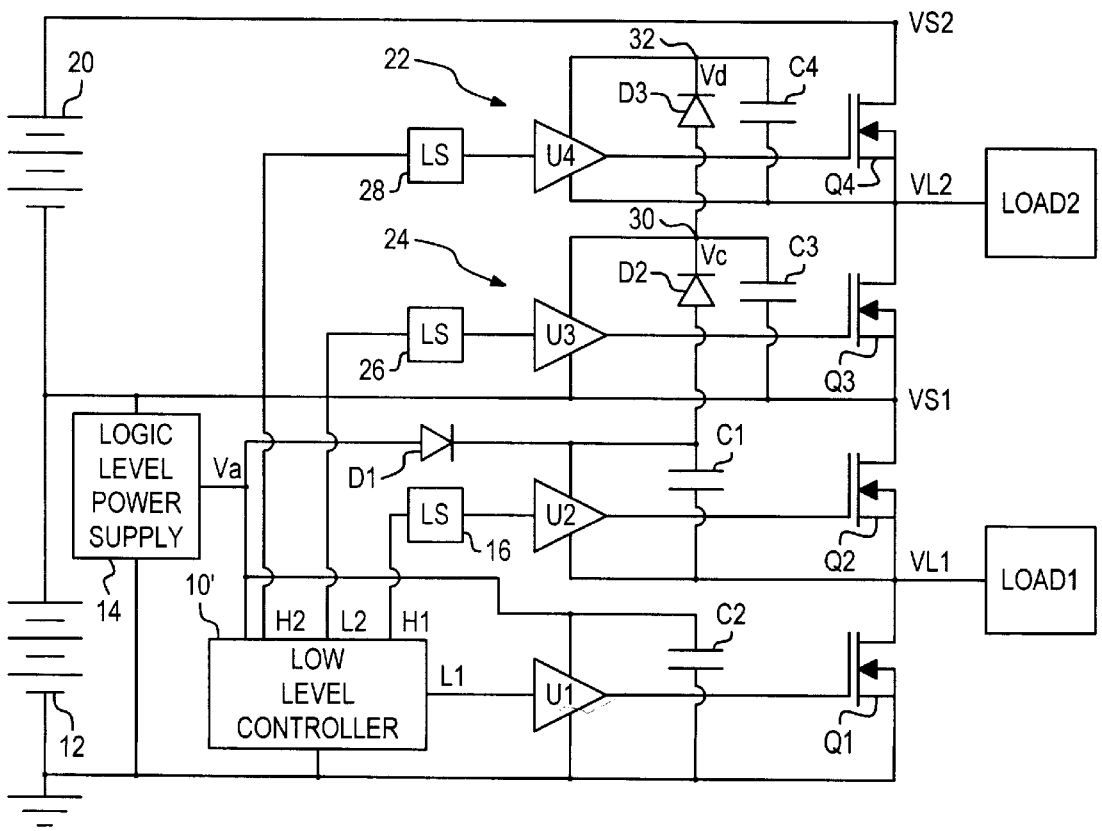
FIG. 2 is a circuit diagram of a gate drive circuit according to this invention for a multiple power supply bridge circuit.

FIG. 2 depicts a multiple power supply bridge circuit which includes all of the elements of the single power supply bridge circuit of FIG. 1, plus an additional power supply in the form of storage battery 20, and another pair of bridge transistors Q3, Q4 and associated gate drive circuits 22, 24 coupled to a second load LOAD2. The loads LOAD1, LOAD2 may be any electrical loads, such as resonant tank circuits for a DC-to-DC converter, for example. The negative terminal of battery 20 is coupled to the positive terminal of battery 12, providing a lower power supply voltage identified as VS1 and an upper power supply voltage identified as VS2, where VS1 corresponds to the power supply voltage VS of FIG. 1. In the circuit of FIG. 2, the Low Level Controller 10' differs somewhat from the Low Level Controller 10 of FIG. 1 in that it now generates control signals L2 and H2 for bridge transistors Q3 and Q4 in addition to the control signals L1 and H1 for bridge transistors Q1 and Q2. However, according to this invention, no additional logic level power supplies beyond the Logic Level Power Supply 14 are required for gate drive circuits 22 and 24, as explained below.

The gate drive circuits 22 and 24 are configured similar to the drive circuit for high-side transistor Q2. In each case, a gate drive amplifier U3, U4 is coupled to the gate of the respective bridge transistor Q3, Q4, and level shifters (LS) 26, 28 are used to interface the control signals L2, H2 to the respective gate drive amplifiers U3, U4 since the logic level voltage Va is lower than the power supply voltage VS1. Similar to the bridge transistors Q1 and Q2, the control signals L2, H2 bias the bridge transistors Q3, Q4 alternately on and off to alternately couple electrical load LOAD2 to power supply voltage VS1 and power supply voltage VS2.

It will be apparent that the conventional bootstrap approach used to drive the high-side transistor Q2 will not work for the bridge transistors Q3, Q4 associated with battery 20 since the logic level voltage Va is not high enough to charge bypass capacitors for gate drive amplifiers U3 or U4. Accordingly, the conventional approach is to provide an additional logic level power supply to form a logic level voltage between the power supply voltages VS1 and VS2, and to simply extend the bootstrap gate drive circuitry of FIG. 1 to the gate drive amplifiers U3 and U4. However, the present invention avoids the expense of an additional logic level power supply by using the by-pass capacitor C1 to charge by-pass capacitors C3 and C4 for the gate drive amplifiers U3 and U4. Thus, the by-pass capacitor C1 is coupled via diode D2 to the junction 30 of by-pass capacitor C3, which in turn, is coupled via diode D3 to the junction 32 of by-pass capacitor C4.

In operation, the by-pass capacitor C1 is charged substantially to the logic level voltage Va through diode D1 during on periods of low-side transistor Q1. When control signal H1 changes states to turn on high side transistor Q2, load voltage VL1 rises substantially to source voltage VS1, and the by-pass capacitor C1 charges by-pass capacitor C3 (through diode D2 and bridge transistor Q2) in addition to supplying the required energy to gate drive amplifier U2. The by-pass capacitor C2 is recharged each time low-side transistor Q1 is biased on, as explained above. Consequently, the by-pass capacitor C3 becomes charged, and supplies energy to gate drive amplifier U3 at gate drive voltage Vc when the control signal L2 signals a conduction period of bridge transistor Q3. When bridge transistor Q3 becomes conductive, the load voltage VL2 between transistors Q3 and Q4 drops substantially to power supply voltage VS1, and the by-pass capacitor C3 additionally charges by-pass capacitor C4 through diode D3 and bridge transistor Q3. Consequently, the by-pass capacitor C4 becomes charged, and supplies energy to gate drive amplifier U4 at gate drive voltage Vd when the control signal H2 signals a conduction period of bridge transistor Q4. It will be apparent that LOAD1 may be omitted, if desired, and that the timing of control signals L2, H2 does not have to be phase or frequency related to the control signals L1, H1.

In summary, a single logic level voltage Va referenced to a first input power supply (battery 12) is used according to this invention to provide gate drive voltages for bridge transistors associated with a second power supply (battery 20). The logic level voltage Va is bootstrapped to by-pass capacitor C1 to provide a gate drive voltage Vb for the high-side transistor Q2 associated with the first source, and the charge on by-pass capacitor C1 is consecutively bootstrapped to by-pass capacitors C3 and C4 to provide gate drive voltages Vc and Vd for bridge transistors Q3 and Q4 associated with the second power supply. While described in reference to the illustrated embodiment, it is expected that various modifications in addition to those mentioned above will occur to persons skilled in the art. For example, the circuitry of this invention applies to full-wave bridge circuits, and may be extended to additional bridge transistors, whether associated with the second power supply or one or more additional power supplies. Accordingly, it should be understood that gate drive circuits incorporating such modifications may fall within the scope of this invention, which is defined by the appended claims.

What is claimed:

1. A multiple power supply transistor bridge circuit comprising:
    first and second series connected power supplies defining a ground potential, and first and second power supply voltages relative to said ground potential;
    first and second bridge transistors coupled to said first power supply voltage, a third bridge transistor connected in series with said second bridge transistor to form a bridge circuit for said second power supply, and a fourth bridge transistor connected in series with said first bridge transistor to form a bridge circuit for said first power supply, each of said bridge transistors having a gate drive amplifier for biasing the respective bridge transistor on and off in accordance with a control signal applied thereto;
    a logic level power supply coupled between said first power supply voltage and ground potential for establishing a logic level voltage relative to said ground voltage;
    a first by-pass capacitor coupled to said logic level voltage and to a junction between said first and fourth bridge transistors for receiving charging current from said logic level power supply when said fourth bridge transistor is biased on, thereby to establish a first gate drive voltage for the gate drive amplifier of said first bridge transistor; and
    a second by-pass capacitor coupled to said first power supply voltage and to said first by-pass capacitor for receiving charging current from said first by-pass capacitor when said first bridge transistor is biased on, thereby to establish a second gate drive voltage for the gate drive amplifier of said second bridge transistor.

2. The transistor bridge circuit of claim 1, wherein the second by-pass capacitor is coupled to the first by-pass capacitor via a first diode poled to prevent discharge of said second by-pass capacitor through said first by-pass capacitor.

3. The transistor bridge circuit of claim 1, further comprising:
    a third by-pass capacitor coupled to said second by-pass capacitor and to a junction between said second and third bridge transistors for receiving charging current from said second by-pass capacitor when said second bridge transistor is biased on, thereby to establish a third gate drive voltage for the gate drive amplifier of said third bridge transistor.

4. The transistor bridge circuit of claim 3, wherein the third by-pass capacitor is coupled to the second by-pass capacitor via a diode poled to prevent discharge of said third by-pass capacitor through said second by-pass capacitor.

5. The transistor bridge circuit of claim 1, further comprising:
    a controller coupled between said logic level voltage and ground potential for developing the control signals for each of said bridge transistors.

* * * * *